(12) United States Patent
Lienau et al.

(10) Patent No.: US 8,081,507 B2
(45) Date of Patent: Dec. 20, 2011

(54) TRI-STATE MEMORY DEVICE AND METHOD

(76) Inventors: Richard Lienau, Pecos, NM (US); Brent E. Boerger, Essex Junction, VT (US)

( * ) Notice: Subject to any disclaimer, the term of this patent is extended or adjusted under 35 U.S.C. 154(b) by 13 days.

(21) Appl. No.: 12/567,218

(22) Filed: Sep. 25, 2009

(65) Prior Publication Data

US 2010/0074002 A1 Mar. 25, 2010

Related U.S. Application Data

(60) Provisional application No. 61/100,200, filed on Sep. 25, 2008.

(51) Int. Cl.
*G11C 11/18* (2006.01)

(52) U.S. Cl. .................. 365/170; 365/171; 365/145

(58) Field of Classification Search .................. 365/170, 365/171, 145
See application file for complete search history.

(56) References Cited

U.S. PATENT DOCUMENTS

| | | | |
|---|---|---|---|
| 5,295,097 A | 3/1994 | Lienau | |
| 6,140,139 A | 10/2000 | Lienau | |
| 6,229,729 B1 | 5/2001 | Lienau | |
| 6,266,267 B1 | 7/2001 | Lienau | |
| 6,288,929 B1 | 9/2001 | Lienau | |
| 6,317,354 B1 | 11/2001 | Lienau | |
| 6,330,183 B1 | 12/2001 | Lienau | |
| 6,341,080 B1 | 1/2002 | Lienau | |
| 6,545,908 B1 | 4/2003 | Lienau | |
| 6,711,069 B2 | 3/2004 | Lienau | |
| 6,864,711 B2 | 3/2005 | Lienau | |
| 6,873,546 B2 | 3/2005 | Lienau | |
| 7,023,727 B2 | 4/2006 | Lienau | |
| 7,123,050 B2 | 10/2006 | Lienau | |
| 7,224,601 B2 * | 5/2007 | Panchula | 365/158 |
| 7,616,476 B2 * | 11/2009 | Hidaka | 365/158 |
| 2004/0264243 A1 * | 12/2004 | Lienau et al. | 365/171 |
| 2009/0147562 A1 * | 6/2009 | Clinton et al. | 365/158 |
| 2010/0149676 A1 * | 6/2010 | Khizorev et al. | 360/55 |

* cited by examiner

*Primary Examiner* — Fernando N. Hidalgo
(74) *Attorney, Agent, or Firm* — Webb IP Law Group; Jason P. Webb; Danny Y. H. Cheng

(57) ABSTRACT

A non-volatile tri-state random access memory device, including a permanent magnetic bit; a write module in functional communication with the permanent magnetic bit and configured to selectably alter the permanent magnetic bit between three magnetic states, a write module including a write coil disposed about the permanent magnetic bit and in communication with a source of electrical power; and a read module in functional communication with the permanent magnetic bit and configured to observe and communicate each of three magnetic states of the permanent magnetic bit, the read module including a read sensor coupled to a read return line.

17 Claims, 8 Drawing Sheets

TRI-STATE MEMORY DEVICE AND METHOD

CROSS-REFERENCE TO RELATED APPLICATIONS

This invention claims priority, under 35 U.S.C. §120, to the U.S. Provisional Patent Application No. 61/100,200 by Lienau et al. filed on Sep. 25, 2008 which is incorporated by reference herein in its entirety.

BACKGROUND OF THE INVENTION

1. Field of the Invention

The present invention relates to memory devices and methods, specifically to memory devices and methods capable of storing more than two states.

2. Description of the Related Art

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. The constant refreshing of the memory cells is not a problem when there is an unlimited voltage source, but in many applications, like laptop computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a non-volatile memory device that does not need to be refreshed and is inexpensive and quick to make. Additionally, in a ferromagnetic memory array, it has generally been necessary to provide a wholly separate circuit to detect the polarity, and thus the binary value, of the remnant magnetic field of a ferromagnetic digital memory cell. For example, many current ferromagnetic memories use such techniques as "giant magneto resistance" and the Hall effect to sense the magnetic polarity of memory bits. These require circuitry in addition to that used for state change, and in some cases many extra steps to fabricate. The requirement of a separate sensing circuit adds considerably to the time and expense of fabrication. This additional circuitry also limits the density of the memory cells in an array, and effects the time required to read, or sense the magnetic polarity, or value.

In the digital memory arena, especially random access memory, fast, dense non-volatility is an advantage. Accordingly, it is desirable to have a non-volatile memory array wherein the remnant magnetic field is sensed with the same circuitry used to write, or effect the state change of, a ferromagnetic bit in such a memory cell.

Some improvements have been made in the field. Examples of references related to the present invention are described below, and the supported teachings of each reference are incorporated by reference herein:

U.S. Pat. No. 7,123,050 to Lienau and entitled Programmable array logic circuit employing non-volatile ferromagnetic memory cells describes a programmable array logic circuit whose temporary memory circuitry employs single bit non-volatile ferromagnetic memory cells. The ferromagnetic memory cells or bits store data even when there is no power provided to the circuitry, thus saving power during operation of the programmable logic circuitry, and ensuring that there is no loss of the data should there be a temporary power shut down. Additionally, the ferromagnetic cells provide for indefinite number of switching actions on the data without degradation to the capacity to store data therein. There is described an integrated circuit, comprising a programmable logic circuit array having product lines and input lines therein, and a storage register circuit. The storage register circuit has a ferromagnetic bit and sensor coupled to store a remnant control signal and an output transistor, coupled to be responsive to the remnant control signal on its gate, and coupled between an input and product line. Additionally, the integrated circuit may further include a logical AND array and a logical OR array.

U.S. Pat. No. 7,023,727 to Lienau and entitled Non-volatile ferromagnetic memory having sensor circuitry shared with its state change circuitry describes a ferromagnetic memory cell is disclosed having a base, oriented in a horizontal plane, a bit, made of a ferromagnetic material, and a sense/write line, positioned proximate the bit sufficient to detect the directed polarity of the bit when a first current is applied thereto, and to direct the polarity of the bit when a second larger current is applied thereto in a given direction. The bit has a height that is oriented perpendicular to the horizontal plane of the base, and a polarity that can be directed along the height.

U.S. Pat. No. 6,873,546 to Lienau and entitled Method and apparatus for reading data from a ferromagnetic memory cell describes a ferromagnetic memory cell is disclosed. The cell includes a bit, made of a ferromagnetic material, having a remnant polarity. The cell also includes a read drive line coupled to a first portion of the bit, to feed a current into the bit. A sense conductor is coupled to a second portion of the bit, to receive the current from the bit. The current conducted through the bit is responsive to the polarity of the bit. A method is also disclosed for determining the magnetic polarity of a ferromagnetic bit. In this method, a bit is provided that is made of ferromagnetic material and has a remnant polarity. An input current is fed into the bit through a read drive line coupled to a first portion of the bit. An output current is received from the bit through a sense conductor coupled to a second portion of the bit. The current conducted through the bit is responsive to the polarity of the bit. A variance between the input current and output current is then sensed, from which the magnetic polarity of the bit is determined.

U.S. Pat. No. 6,864,711 to Lienau and entitled Programmable array logic circuit whose product and input line junctions employ single bit non-volatile ferromagnetic cells describes a programmable array logic circuit whose temporary memory circuitry employs single bit non-volatile ferromagnetic memory cells. There is described an integrated circuit, comprising a programmable logic circuit array having product lines and input lines therein, and a storage register circuit. The storage register circuit has a ferromagnetic bit and sensor coupled to store a remnant control signal and an output transistor, coupled to be responsive to the remnant control signal on its gate, and coupled between an input and product line. Additionally, the integrated circuit may further include a logical AND array and a logical OR array.

U.S. Pat. No. 6,711,069 to Lienau and entitled Register having a ferromagnetic memory cells describes a register. There is described use of a non-volatile ferromagnetic memory cell to store binary data in a register or flip-flop circuit. There is described a latching circuit, comprising an input line entering the latching circuit for receiving a signal, an output line, electrically coupled to the input line, for outputting the signal, and a ferromagnetic bit and sensor coupled between the input line and the output line, to store a form of the signal in the ferromagnetic bit even when power has been suspended to the latching circuit.

U.S. Pat. No. 6,545,908 to Lienau and entitled Dual conductor inductive sensor for a non-volatile random access ferromagnetic memory describes a nonvolatile ferromagnetic RAM device which is capable of reading the data stored in each magnet quickly and efficiently utilizing a minimal number of components. Specifically there is a nonvolatile ferromagnetic RAM which is capable of reading the data stored in each magnetic bit. The ferromagnetic memory cell, comprising of a base that is oriented in a horizontal plane. There is also a bit, made of a ferromagnetic material, having: a height that is oriented perpendicular to the horizontal plane of the base, and a polarity that can be directed along the height. Additionally, there is a sense line, positioned proximate the bit sufficient to detect the directed polarity of the bit; and a write line, positioned proximate the bit sufficient to direct the polarity of the bit. Additionally, there is a detector, coupled to the sense line; and a sample drive line, positioned proximate the bit to transmit an electric pulse that will increase the directed polarity of the bit sufficient to induce a wave into the sense line that can be detected by the detector.

U.S. Pat. No. 6,341,080 to Lienau and entitled Hall effect ferromagnetic random access memory device and its method of manufacture describes a Hall effect ferromagnetic nonvolatile random access memory cell comprising a Hall effect sensor adjacent to a ferromagnetic bit which is surrounded by a drive coil. The coil is electrically connected to a drive circuit, and when provided with an appropriate current creates a residual magnetic field in the ferromagnetic bit, the polarity of which determines the memory status of the cell. The Hall effect sensor is electrically connected via four conductors to a voltage source, ground, and two read sense comparator lines for comparing the voltage output to determine the memory status of the cell. The read and write circuits are arranged in a matrix of bit columns and byte rows. A method for manufacturing said Hall effect ferromagnetic non-volatile random access memory cell.

U.S. Pat. No. 6,330,183 to Lienau and entitled Dual conductor inductive sensor for a non-volatile random access ferromagnetic memory describes a nonvolatile ferromagnetic RAM device which is capable of reading the data stored in each magnet quickly and efficiently utilizing a minimal number of components. Specifically there is a nonvolatile ferromagnetic RAM which is capable of reading the data stored in each magnetic bit. The ferromagnetic memory cell, comprising of a base that is oriented in a horizontal plane. There is also a bit, made of a ferromagnetic material, having: a height that is oriented perpendicular to the horizontal plane of the base, and a polarity that can be directed along the height. Additionally, there is a sense line, positioned proximate the bit sufficient to detect the directed polarity of the bit; and a write line, positioned proximate the bit sufficient to direct the polarity of the bit. Additionally, there is a detector, coupled to the sense line; and a sample drive line, positioned proximate the bit to transmit an electric pulse that will increase the directed polarity of the bit sufficient to induce a wave into the sense line that can be detected by the detector.

U.S. Pat. No. 6,317,354 to Lienau and entitled Non-volatile random access ferromagnetic memory with single collector sensor describes a non-volatile RAM device is disclosed which utilizes a plurality of ferromagnetic bits each surrounded by a coil of a write line for directing the remnant polarity thereof is disclosed. The direction of magnetic remnance in each bit is dictated by the direction of a current induced into write line. Further, a magneto sensor comprising a magneto resistor coupled to a collector is placed approximate each bit. The magneto resistor is coupled to a control circuit for receiving current. The current passing across magneto resistor is biased in a direction either right or left of the original current flow direction. The collector is coupled to a sense line, which in turn, is coupled to an amplifier. When current flow is biased in the direction of the collector, the serial resistance of the magneto resistor will be decreased, and the sense line will receive a high amount of current. However, when current flow is biased in the direction away from the collector, then the serial resistance of the magneto resistor will be effectively increased, and the sense line will receive a small amount of current. The presence and amount of current in the sense line is amplified and detected by the amplifier.

U.S. Pat. No. 6,288,929 to Lienau and entitled Magneto resistor sensor with differential collectors for a non-volatile random access ferromagnetic memory describes a non-volatile RAM device which utilizes a plurality of ferromagnetic bits each surrounded by a coil of a write line for directing the remnant polarity thereof is disclosed. The direction of magnetic remnance in each bit is dictated by the direction of a current induced into write line. Further, a magneto sensor comprising a magneto resistor coupled to a pair of collectors is placed approximate each bit. The magneto resistor is coupled to a control circuit for receiving current. The current passing across magneto resistor is biased in a direction either right or left of the original current flow direction. The collectors are coupled to a pair of sense lines, which are in turn, coupled to a voltage differential amplifier. The collector in the direction of biased current flow, will receive a greater number of electrons than the other collector, and therefore have a greater negative charge. This voltage differential is conducted through the sense lines to the voltage differential amplifier, where it is amplified and detected.

U.S. Pat. No. 6,266,267 to Lienau and entitled Single conductor inductive sensor for a non-volatile random access ferromagnetic memory describes a nonvolatile ferromagnetic RAM device and method that is capable of reading the data stored in each magnet quickly and efficiently utilizing a minimal number of components. Specifically, there is a nonvolatile ferromagnetic RAM which is capable of reading the data stored in each magnetic bit. There is a ferromagnetic memory cell, comprising a bit, made of a ferromagnetic material, having a remnant polarity. A write line, located proximate the bit, is coupled to receive: 1) a first current sufficient to create the remnant polarity, and 2) a pulsed second current, insufficient to create any remnant polarity, but sufficient to potentially fluctuate the remnant polarity during the second current pulse. A sense line, positioned proximate the bit, has the purpose of detecting any potentially created remnant polarity fluctuation.

U.S. Pat. No. 6,229,729 to Lienau and entitled Magneto resistor sensor with diode short for a non-volatile random access ferromagnetic memory describes a non-volatile RAM device is disclosed which utilizes a plurality of ferromagnetic bits each surrounded by a write coil for directing the remnant polarity thereof is disclosed. The direction of magnetic remnance in each bit is dictated by the direction of a current induced into write coil. Further, a magneto sensor comprising a magneto resistor coupled to a diode is placed approximate each bit. The magneto resistor is coupled to a sense line, and receives current at a first point of attachment, and returns current at a second point of attachment. The current passing across magneto resistor is biased in a direction either right or left of the original current flow direction. If current is biased toward the anode end of diode then it is complimentary to the preferred flow direction of diode, and flows easily there across. The ultimate effect is that the serial resistance of magneto resistor is reduced, allowing a greater amount of current to pass into the sense line. When current is biased toward the cathode end of diode, then it is contrary to the preferred flow direction of the diode, and does not flow easily there across. The ultimate effect is that the serial resistance of magneto resistor is increased, allowing a smaller amount of current to pass into sense line. The presence and amount of current found in the sense line between the bit and the detector determines whether a digital value of "1" or "0" is stored in the magnetic bit. A method for storing binary data is also disclosed.

U.S. Pat. No. 6,140,139 to Lienau and entitled Hall effect ferromagnetic random access memory device and its method of manufacture describes a Hall effect ferromagnetic nonvolatile random access memory cell comprising a Hall effect sensor adjacent to a ferromagnetic bit which is surrounded by a drive coil. The coil is electrically connected to a drive circuit, and when provided with an appropriate current creates a residual magnetic field in the ferromagnetic bit, the polarity of which determines the memory status of the cell. The Hall effect sensor is electrically connected via four conductors to a voltage source, ground, and two read sense comparator lines for comparing the voltage output to determine the memory status of the cell. The read and write circuits are arranged in a matrix of bit columns and byte rows.

U.S. Pat. No. 5,295,097 to Lienau and entitled Nonvolatile random access memory describes a nonvolatile random access memory is disclosed having a substrate carrying separate magnetically polarizable domains each surrounded by a full write loop member and arranged to penetrate the Hall channel of a dual drain FET with its residual magnetic field. The domains are organized in word rows and bit columns, are each written to by a single full write current through the surrounding loop member and each read by a comparator connected to the FET drains.

One or more of the inventions heretofore known suffer from a number of disadvantages which include only having bits with binary states; having a low memory/volume ratio; requiring the inclusion of many components; requiring the inclusion of many manufacturing steps; requiring many masks to produce; consuming a great amount of power per bit; requiring exotic chemical processing; and being otherwise expensive and/or difficult to manufacture.

What is needed is a memory device and/or method that solves one or more of the problems described herein and/or one or more problems that may come to the attention of one skilled in the art upon becoming familiar with this specification.

SUMMARY OF THE INVENTION

The present invention has been developed in response to the present state of the art, and in particular, in response to the problems and needs in the art that have not yet been fully solved by currently available memory devices and methods. Accordingly, the present invention has been developed to provide a device, system, and/or method for storing information.

In one embodiment, there is a memory device that may be non-volatile, tri-state, and/or random access. The device may include a bit that may be magnetic and may be of a permanent magnetic configuration; a write module that may be in functional communication with the bit and/or configured to selectably alter the permanent magnetic bit, or bit, between three magnetic states; and/or a read module that may be in functional communication with the permanent magnetic bit, or bit, and may be configured to observe and/or communicate one, or more, or each of three or more magnetic states of the permanent magnetic bit, or bit. The read module may include a read sensor that may be coupled to a read return line. The write module may include a write coil that may be disposed about the permanent magnetic bit, or bit, and may be in communication with a source of electrical power.

The permanent magnetic bit may include a pair of substantially co-linear elongated ferromagnetic members. The write module may include a pair of independently operable write coils that may each be associated with a separate ferromagnetic member. The permanent magnetic bit may include or may consist of a single elongated ferromagnetic member.

The write module may include a damped oscillator circuit that may be functionally coupled to the write coil, such that an oscillating signal driven through the write coil may be damped. The write module may be configured to write a magnetic state in two clock cycles.

The read sensor may include a Hall effect sensor that may be disposed near the permanent magnetic bit, or the bit. The read sensor may include a resistive coupled sensor that may be disposed near the permanent magnetic bit.

In another embodiment, the device may include exactly and only one transistor that is functionally coupled to the read sensor.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order for the advantages of the invention to be readily understood, a more particular description of the invention briefly described above will be rendered by reference to specific embodiments that are illustrated in the appended drawing(s). It is noted that the drawings of the invention are not to scale. The drawings are mere schematics representations, not intended to portray specific parameters of the invention. Understanding that these drawing(s) depict only typical embodiments of the invention and are not, therefore, to be considered to be limiting its scope, the invention will be described and explained with additional specificity and detail through the use of the accompanying drawing(s), in which.

DETAILED DESCRIPTION OF THE INVENTION

Figure 1:
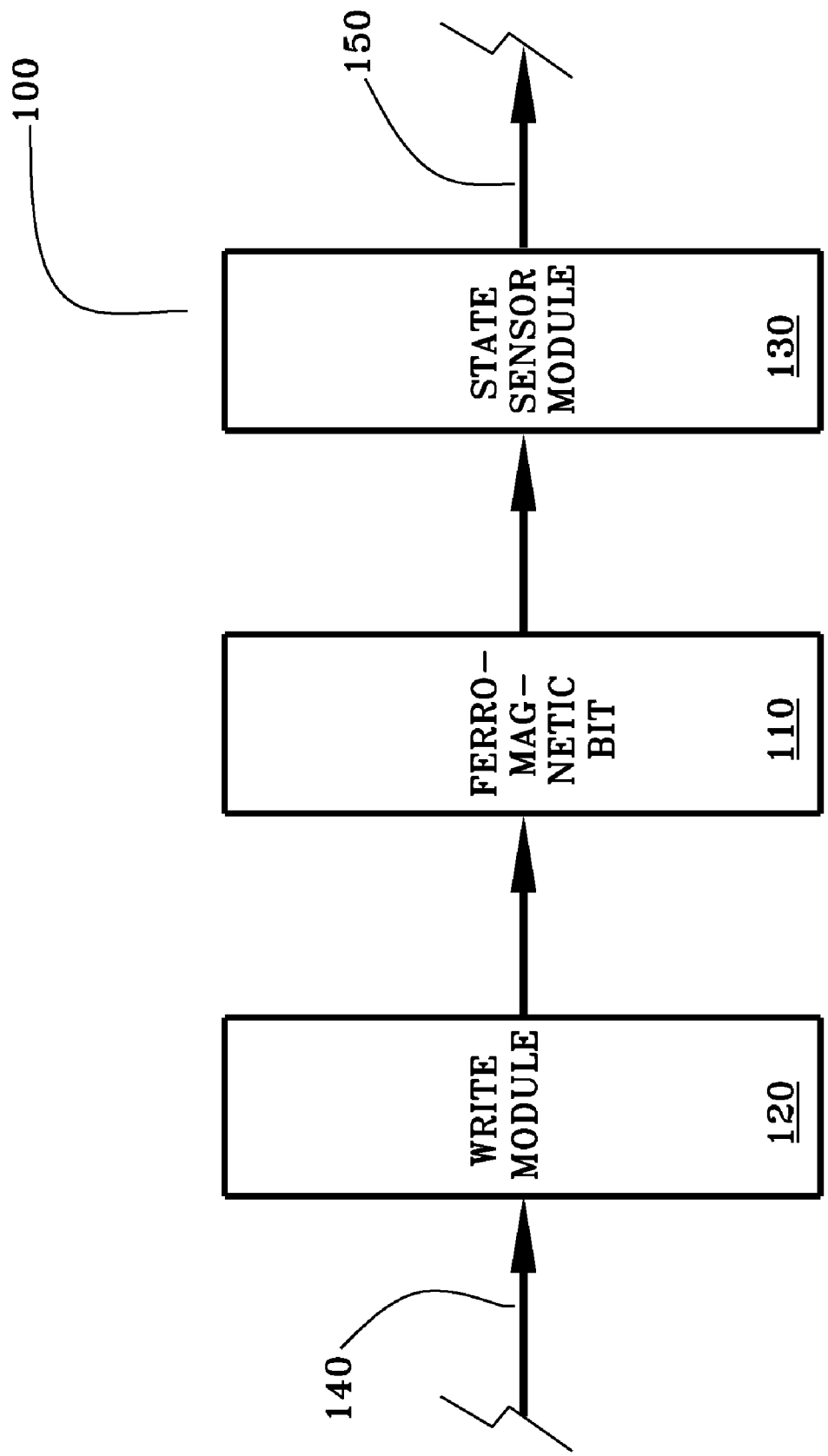
FIG. 1 is a block diagram illustrating a tri-state memory cell according to one embodiment of the invention.

For the purposes of promoting an understanding of the principles of the invention, reference will now be made to the exemplary embodiments illustrated in the drawing(s), and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Reference throughout this specification to an "embodiment," an "example" or similar language means that a particular feature, structure, characteristic, or combinations thereof described in connection with the embodiment is included in at least one embodiment of the present invention. Thus, appearances of the phrases an "embodiment," an "example," and similar language throughout this specification may, but do not necessarily, all refer to the same embodiment, to different embodiments, or to one or more of the figures. Additionally, reference to the wording "embodiment," "example" or the like, for two or more features, elements, etc. does not mean that the features are necessarily related, dissimilar, the same, etc.

Each statement of an embodiment, or example, is to be considered independent of any other statement of an embodiment despite any use of similar or identical language characterizing each embodiment. Therefore, where one embodiment is identified as "another embodiment," the identified embodiment is independent of any other embodiments characterized by the language "another embodiment." The features, functions, and the like described herein are considered to be able to be combined in whole or in part one with another as the claims and/or art may direct, either directly or indirectly, implicitly or explicitly.

As used herein, "comprising," "including," "containing," "is," "are," "characterized by," and grammatical equivalents thereof are inclusive or open-ended terms that do not exclude additional unrecited elements or method steps. "Comprising" is to be interpreted as including the more restrictive terms "consisting of" and "consisting essentially of."

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of programmable or executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module and/or a program of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The present invention may be described herein in terms of functional block components, screen shots, user interaction, optional selections, various processing steps, and the like. Each of such described herein may be one or more modules in exemplary embodiments of the invention. It should be appreciated that such functional blocks may be realized by any number of hardware and/or software components configured to perform the specified functions. For example, the present invention may employ or may be employed within various integrated circuit components, e.g., memory elements, processing elements, logic elements, look-up tables, and the like, which may carry out a variety of functions under the control of one or more microprocessors or other control devices. Similarly, the software elements of the present invention may be implemented with any programming or scripting language such as C, C++, Java, COBOL, assembler, PERL, Visual Basic, SQL Stored Procedures, AJAX, extensible markup language (XML), with the various algorithms being implemented with any combination of data structures, objects, processes, routines or other programming elements. Further, it should be noted that the present invention may employ any number of conventional techniques for data transmission, signaling, data processing, network control, and the like. Still further, the invention may detect or prevent security issues with a client-side scripting language, such as JavaScript, VBScript or the like.

FIG. 1 is a block diagram illustrating a tri-state memory cell 100 according to one embodiment of the invention. There is shown a ferromagnetic bit 110 in communication with a state sensor 130 and a write module 120. The write module 120 is in communication 140 with a circuit configured to deliver write signals. The state sensor module 130 is in communication with a circuit configured to receive state signals. In combination, the components make up a memory cell able to store 50% more memory per bit than conventional binary memory bits. This increase in memory per bit translates to an exponential increase in memory storage capabilities. For example, an 8-bit binary storage array has 256 possible configurations, while an 8-bit trinary storage array has 6561 possible configurations. Accordingly, the 8-bit trinary array can store over twenty-five times the information of the binary array.

The illustrated ferromagnetic bit 100 includes ferromagnetic material configured to produce an observable magnetic field. In one non-limiting example, a ferromagnetic bit is a single high aspect-ratio column of ferromagnetic material. In another non-limiting example, a ferromagnetic bit includes a pair of collinear high aspect-ratio columns. The illustrated ferromagnetic bit is configured to be selectably altered between at least three different magnetic states. In one embodiment, the states are North, South, and Null. Other embodiments may include such states in combinations to various degrees and/or across a variety of special orientations.

The state sensor module 130, or state sensor, is configured to observe and differentiate between the three different states of the ferromagnetic bit 110. The state sensor 130 also includes sufficient lines of communication/transmission 150 for communicating the state of the ferromagnetic bit. Non-limiting examples of state sensors include coil sensors and Hall Effect sensors. Generally, state sensors are physically positioned to be proximate the ferromagnetic bit such that small remnant fields are observable.

The write module 120 is configured to cause the ferromagnetic bit to be selectably altered between states. Non-limiting examples of write modules include: field inducing coils and ringing field inducing coils. The write module 120 also includes sufficient lines of communication/transmission 140 for selectably altering the state of the ferromagnetic bit.

Figure 2:
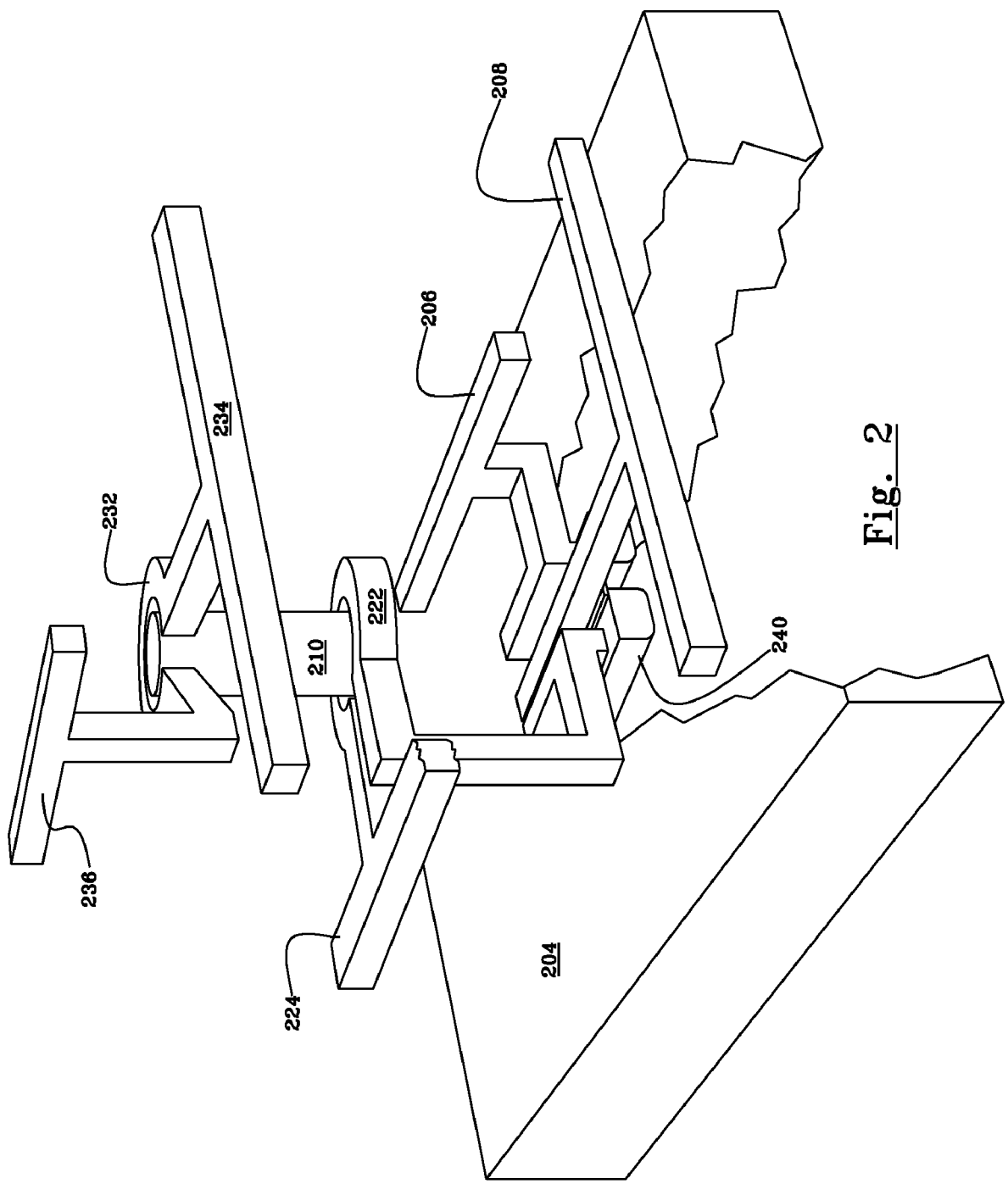
FIG. 2 is a perspective side view of a tri-state memory cell having a single bit with coil sensor according to one embodiment of the invention.

FIG. 2 is a perspective side view of a tri-state memory cell having a single bit with coil sensor according to one embodiment of the invention. There is shown a memory cell including a ferromagnetic bit 210 encircled by a write drive coil 222 and a read drive coil 232. The write drive coil 222 is in communication with the write/read return line 224 and the cell transistor 240 which is functionally coupled to the cell transistor write/read line 206 and the cell transistor gate select line 208. The read drive coil 232 is in communication with the read drive line 234 and the read drive voltage divider return 236. There is also shown a substrate 204 that may provide a support, base, and/or may provide electrical properties (such as a ground) as appropriate. Such a memory cell may be manufactured according to known fabrication techniques such as but not limited to masking, etching, and deposition techniques of materials of varying properties. Not shown is further substrate, filler, and other material but is implied as appropriate according to the understanding of one skilled in the art.

The write drive coil 222 encircles the ferromagnetic bit 210 such that the write drive coil may induce a state change in the ferromagnetic bit between at least three detectable magnetic states, such as but not limited to north, south, and null states. As current flows through the write drive coil, a magnetic field is induced and this magnetic field operates on portions of the ferromagnetic bit such that those portions may be rearranged. Operation of the write drive coil is controlled and powered by the cell transistor and the write/read return line. Operation of the cell transistor is controlled and powered by the cell transistor write/read line and the cell transistor gate select line. The illustrated transistor is a Field Effect Transistor (FET) but it is understood that other transistors and similar gated conduction modules may be similarly used.

Figure 3:
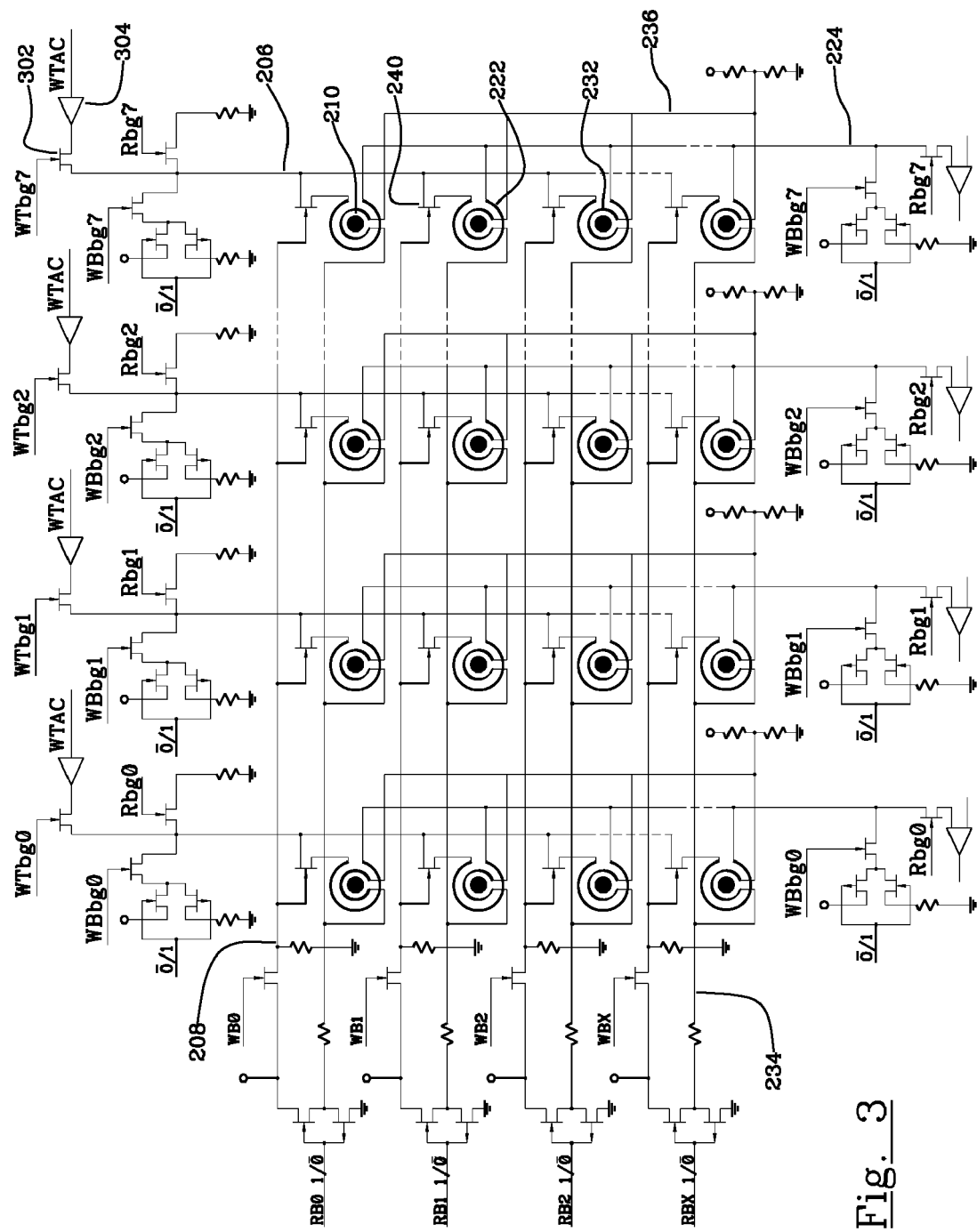
FIG. 3 illustrates a memory array including tri-state memory cells according to one embodiment of the invention.

FIG. 3 illustrates a memory array including tri-state memory cells according to one embodiment of the invention. There is shown a plurality of memory cells similar or identical to that illustrated in FIG. 2. Each cell includes a ferromagnetic bit 210 encircled by a write drive coil 222 and a read drive coil 232. The illustrated write drive coils 222 are in communication with the write/read return lines 224 and the cell transistors 240 which are functionally coupled to the cell transistor write/read lines 206 and the cell transistor gate select lines 208. The read drive coils 232 are in communication with the read drive lines 234 and the read drive voltage divider returns 236.

Individual cells are controlled according to gates, such as but not limited to those labeled WTbg0, WBbg0, WB0, and RB0, wherein the numbering represents array positioning. Further, in the illustrated example, there are shown amplified inputs WTAC functionally coupled to groups of cells through gates WTbg# and configured to selectably provide a modified write signal. The modified write signal induces the ferromagnetic bit to a state detectably different from states generated by north/south states induced through combined operation of WBbg# and WB#. It is envisioned that such third state may be a null state, wherein the ferromagnetic bit is effectively neutralized or placed in a state of no net magnetic field. Alternatively, the ferromagnetic bit may be placed in a state of north/south that is perceptibly different from other north/south states. In one embodiment of the invention, WTAC provides a ringing signal or a damped ringing signal, thereby providing a degaussing effect on the ferromagnetic bit.

In FIG. 3, portions of several cells are numbered according to the numbering of FIG. 2 to indicate similar features and portions. Such illustrative numbering is spread across a plurality of cells to avoid confusing clustering of identifier tags.

In operation, information may be selectably written to desired cells such that each cell may contain a logical 0, 1, or 2 according to its magnetic state. In one embodiment, the 0 and 1 states may be written by combined operation of WB# and WBbg# gates, while the 2 state may be written by combined operation of WB# and WTBbg# gates, whereby the WTAC signal may be transmitted through the write drive coil. Read operations involve RB#, Rbg# and other portions as one skilled in the art would appreciate.

In one non-limiting example, read operations may be performed using paired read cycles. In particular, during a first read cycle, a sample, or "tickler" current is gated in one direction through the Read coil 232, while the W/R Byte Select Gate and the Write coil 222 "listens" with write/read return lines 224 and the comparator at its terminus to test for the presence of a remnant field representing, say, a N/S field. A second read cycle gates a sample current in the opposite direction to test for the opposite binary condition. If one of the read cycles results in a "positive," then the output circuit can report a "zero" or a "one." If neither test shows a binary result, then the result is assumed to be the third option, or null state.

In another non-limiting example, read operations may be performed in a "pure binary" operation condition by using one or the other Read cycle, assuming that the tri-state or "null" Write circuitry has been blocked to effect a binary system.

In still another non-limiting example, a second cycle could be conditionally skipped if where a first cycle results in a "positive."

Figure 4:
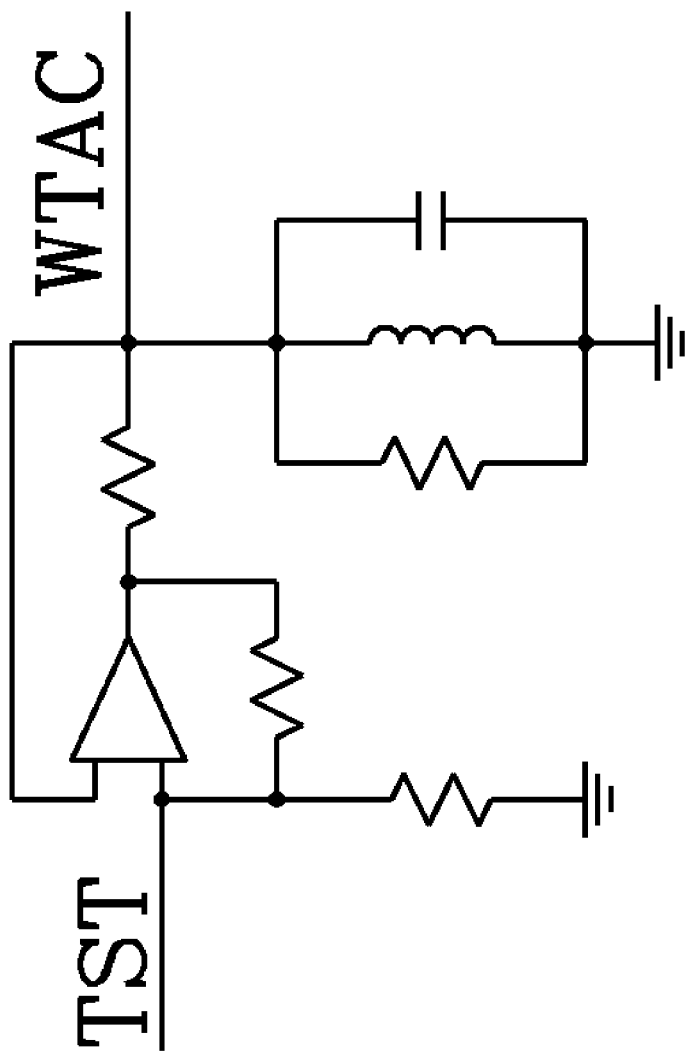
FIG. 4 illustrates a ringing circuit according to one embodiment of the invention.

FIG. 4 illustrates a ringing circuit according to one embodiment of the invention. There is shown a tri-state trigger functionally coupled to a resistive grounded oscillator and a WTAC output line. The tri-state trigger may be a control input coupled to a clock. The illustrated input line, resistors, transistors, coils, and capacitors may be varied as desired to "tune" the circuit to produce a ringing signal having desired characteristics as would be understood by one skilled in the art.

In operation, the ringing circuit is triggered through line TST. Once triggered, an oscillating current develops. The oscillating current is damped over time by the ringing circuit. In one embodiment of the invention, the oscillating current is underdamped, such that a coil coupled thereto may generate alternating magnetic field orientations having successively reduced intensities.

Figure 5:
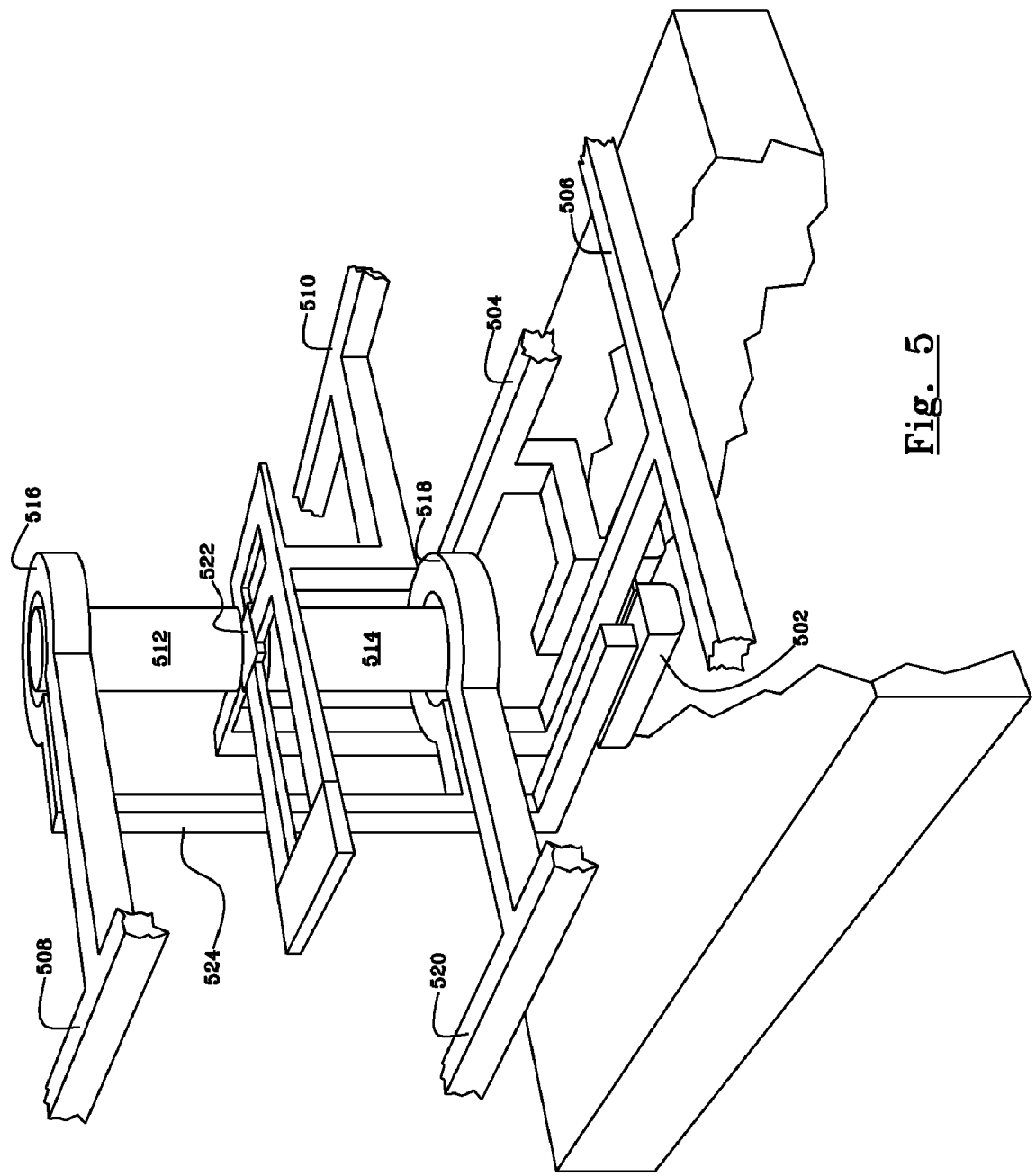
FIG. 5 is a perspective side view of a tri-state memory cell having a dual bit with Hall Effect sensor according to one embodiment of the invention.

FIG. 5 is a perspective side view of a tri-state memory cell having a dual bit with Hall Effect sensor according to one embodiment of the invention. There is shown a first bit 512 collinear with a second bit 514. The first bit 512 and the second bit 514 are each proximate a coil, the first write drive coil 516 and the second write drive coil 518 respectively. The write drive coils 516, 518 are in communication one with the other through a coil coupling line 524 and are also each in communication with first and second write drive return lines 508, 520 respectively. The coil coupling line 524 is in communication with a cell transistor 502 that is functionally coupled to a bit drive line 504 and a gate select line 506. A sensor 522 is disposed between the bits 512, 514 and proximate such that the sensor may detect magnetic fields therefrom. The illustrated sensor is a Hall Effect Sensor coupled to a read line 510 and the gate select line 506. Such a memory cell may be manufactured according to known fabrication techniques such as but not limited to masking, etching, and deposition techniques of materials of varying properties. Not shown is further substrate, filler, and other material but is implied as appropriate according to the understanding of one skilled in the art.

The write drive coils 516, 518 are proximate the bits 512, 514 such that each write drive coil may induce a state change in the associated ferromagnetic bit between at least two detectable magnetic states, such as but not limited to north and south states. As current flows through the write drive coil, a magnetic field is induced and this magnetic field operates on portions of the ferromagnetic bit such that those portions may be rearranged. Operation of the write drive coil is controlled and powered by the cell transistor and the write drive return lines. The coil coupling line 524 permits the operation and control of the dual-coils with fewer lines and component requirements and provides a common drain through the transistor. Operation of the cell transistor is controlled and powered by the cell transistor write/read line and the cell transistor gate select line. The illustrated transistor is a Field Effect Transistor (FET) but it is understood that other transistors and similar gated conduction modules may be similarly used.

Figure 6:
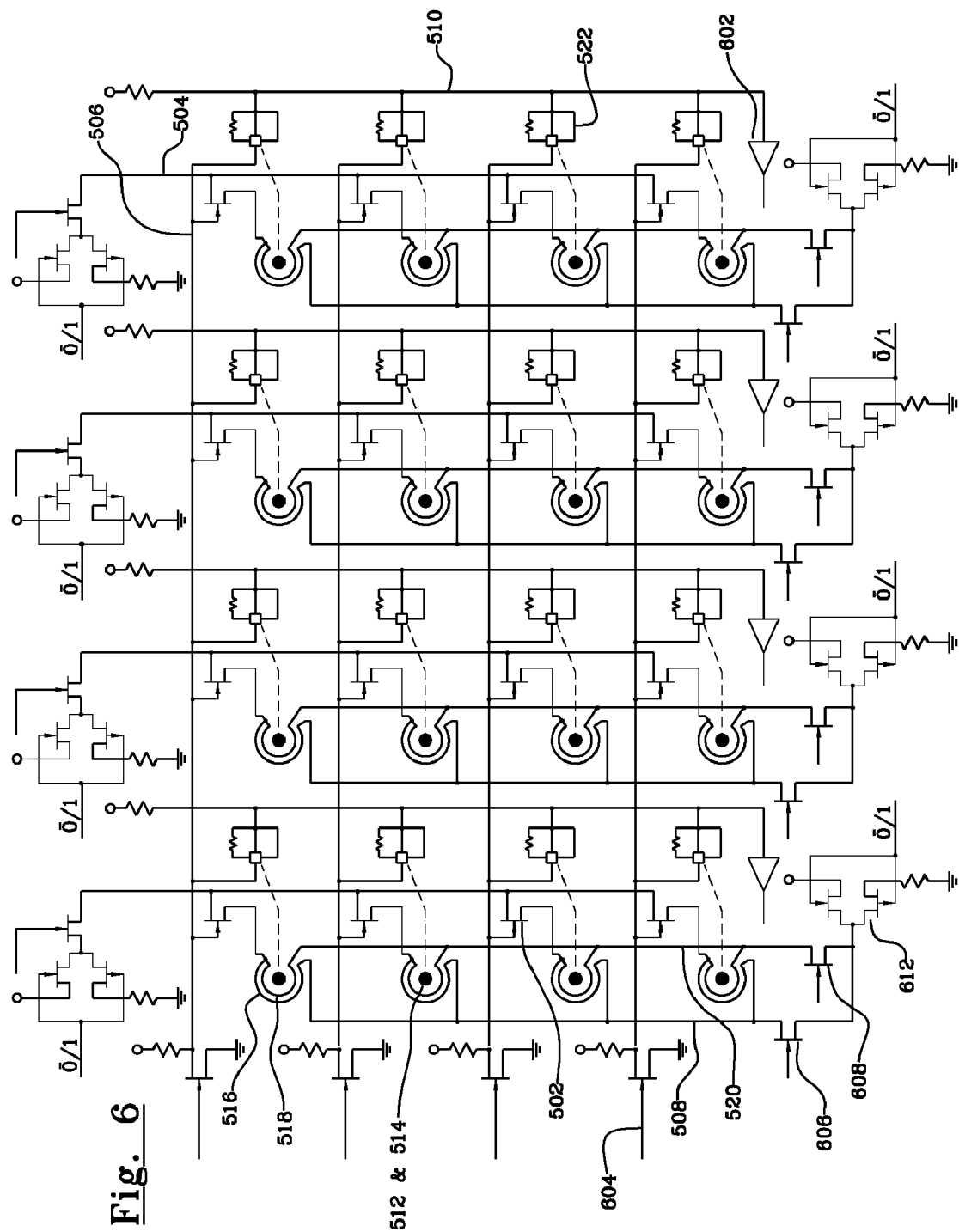
FIG. 6 illustrates a memory array including tri-state memory cells according to one embodiment of the invention.

FIG. 6 illustrates a memory array including tri-state memory cells according to one embodiment of the invention. Portions of several cells are numbered according to the numbering of FIG. 5 to indicate similar features and portions. Such illustrative numbering is spread across a plurality of cells to avoid confusing clustering of identifier tags.

In the illustrated embodiment, first and second write drive gates 606, 608 are in communication with first and second write drive lines 508, 520, respectively. First and second write drive lines 508, 520 are coupled to a plurality of cells having coils 516, 518 disposed about bits 512, 514. Each cell includes a sensor 522 disposed between bits 512, 514 and a transistor 502. Bit transistor select gate line 506 is in communication with a plurality of cells through the sensor 522 and transistor 502 of each. A common bit read line 510 is in communication with a plurality of cells through the sensor 522 and also coupled to a bit read amplifier 602. First and second write drive gates 606, 608 are functionally coupled to write drive circuit 612. A common bit drive line 504 is functionally coupled to a plurality of cells through the transistor 502 of each. A byte write select gate 604 is functionally coupled to the bit transistor select gate line 506.

In operation, information may be selectably written to desired cells such that each cell may contain a logical 0, 1, or 2 according to its magnetic state. In one embodiment, the 0 and 1 states may be written by combined operation of upper and lower write gates 606, 608 and cell transistor 502. A 2 state may be written by sequential operation of upper and lower write gates 606, 608 each combined with cell transistor 502. Read operations involve combined operation of cell sensor 522 and read line 510 and bit read amplifier 602.

Figure 7:
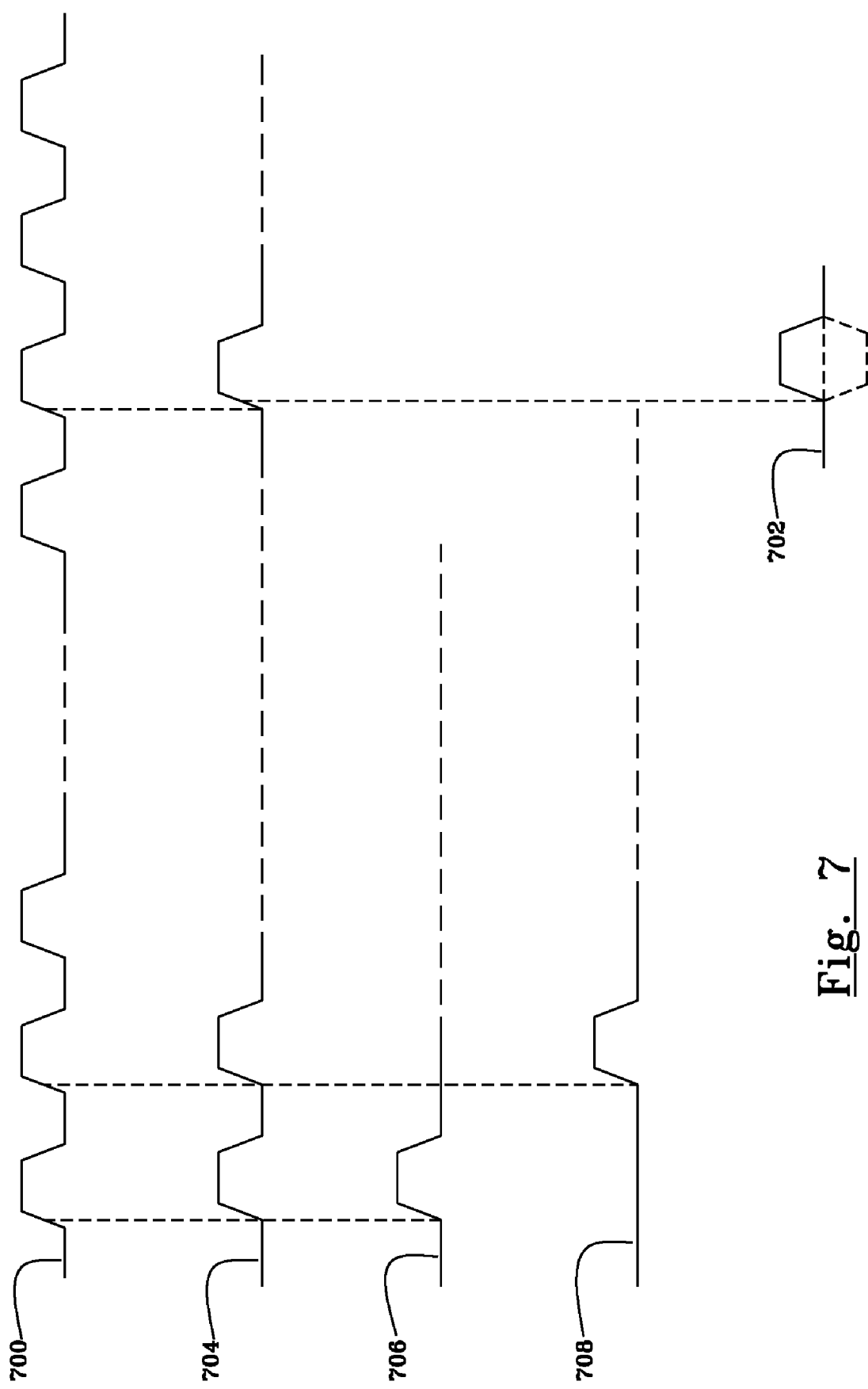
FIG. 7 shows prophetic exemplary control and state signals of a tri-state memory cell according to one embodiment of the invention.

FIG. 7 shows exemplary state signals of a tri-state memory cell according to one embodiment of the invention. There is shown a clock 700 signal upon which all other signals depend for timing. Signal charts 704, 706, and 708 correspond to signals present in portions illustrated in FIG. 6, namely, byte write select gate 604, upper bit select gate 606, and lower bit select gate 608, respectively. Signal chart 702 corresponds to a signal on a bit read amplifier 602 of FIG. 6.

The signals on the left portion of FIG. 7 illustrate a state sequence corresponding to a two cycle write operation wherein the upper and lower bits are driven at separate times. In particular, at the same time the byte write select gate 604, 704 rises, the upper bit select gate 606, 706 rises thereby driving the upper coil and writing to the upper bit. One clock cycle later, in the illustrated example, the byte write select gate 604, 704 rises simultaneous with the lower bit select gate 608, 708 thereby driving the lower coil and writing to the lower bit.

On the left portion of the figure the byte write select gate 604, 704 rises again, this time as a common line to energize the Hall effect sensor 522 (See FIGS. 5 and 6) in the byte row. Read sense line 510 (See FIGS. 5 and 6) is energized as a result. This line is fed to bit read amplifier 602 of FIG. 6 whose output is represented by chart 702.

Figure 11:
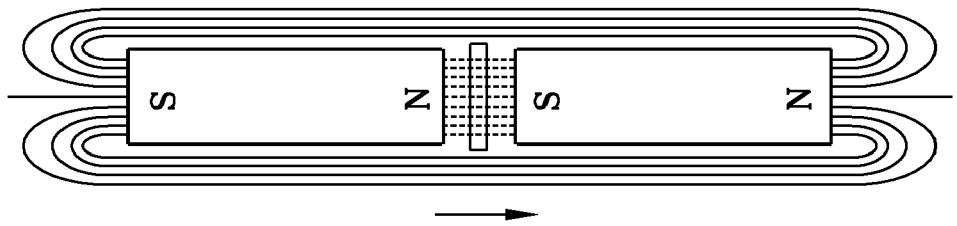
FIGS. 8-11 illustrate exemplary flux states of a dual bit system according to one embodiment of the invention.
Figure 10:
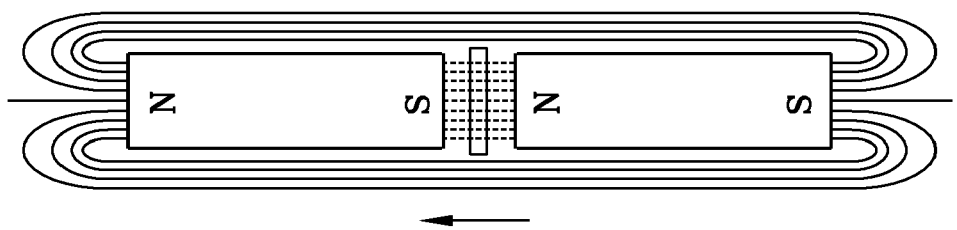
Figure 9:
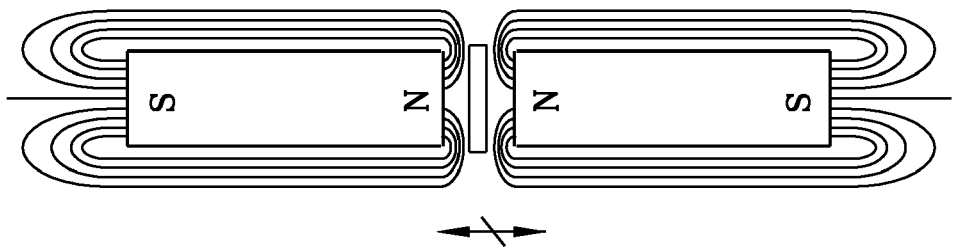
Figure 8:
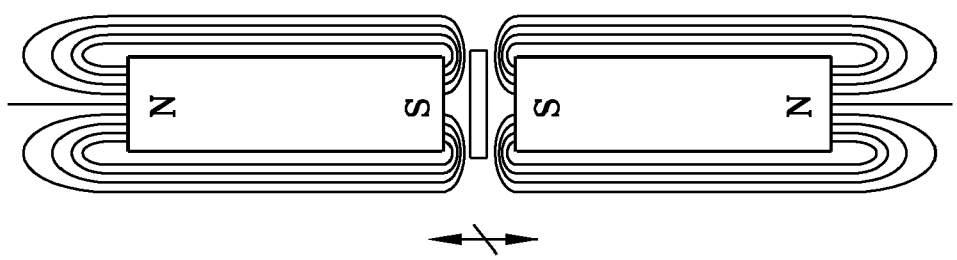

FIGS. 8-11 illustrate exemplary flux states of a dual bit system according to one embodiment of the invention. In particular, FIGS. 8 and 9 illustrate magnetic states of upper and lower bits each resulting in a null-state detected by a sensor placed therebetween. FIGS. 9 and 10 each show upper and lower bits having opposite magnetic states wherein the adjacent poles coincide and therefore magnetic fields operate to repulse one another, thereby substantially canceling each. FIGS. 10 and 11 illustrate magnetic states of upper and lower bits each resulting in a magnetic orientation detected by a sensor placed therebetween. FIGS. 10 and 11 each show upper and lower bits having aligned magnetic states wherein the adjacent poles are opposite and therefore magnetic fields operate to enhance one another, thereby generating a substantial field between the bits.

It is understood that the above-described embodiments are only illustrative of the application of the principles of the present invention. The present invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope.

For example, although the figures illustrate particular relative sizes and shapes, it is understood that there are a near infinite variety of shapes and sizes for portions of the embodiments of the invention and for other material deposition configurations that would provide for the claimed invention.

Additionally, although the figures illustrate a particular relative size and shape for the write drive coil and the read coil, it is understood that there are a near infinite variety of shapes and sizes of coils from which one skilled in the art may choose that are able to cause a state change in the magnetic bit and are able to perceive evidence of such. As a non-limiting example, a coil may include more than one turn that may or may not be co-cylindrical or co-planar to other turns.

It is expected that there could be numerous variations of the design of this invention.

Finally, it is envisioned that the components of the device may be constructed of a variety of materials, including conductors and semi-conductors of all kinds and composites thereof. Further, the magnetic bit may include materials having magnetic properties of all kinds including those other than ferromagnetic.

Thus, while the present invention has been fully described above with particularity and detail in connection with what is presently deemed to be the most practical and preferred embodiment of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims. Further, it is contemplated that an embodiment may be limited to consist of or to consist essentially of one or more of the features, functions, structures, methods described herein.

What is claimed is:

1. A non-volatile tri-state random access memory device, comprising:
   a) a non-volatile magnetic bit;
   b) a write module in functional communication with the non-volatile magnetic bit and configured to selectably alter the non-volatile magnetic bit between three magnetic states, the write module including a write coil disposed about the non-volatile magnetic bit and in communication with a source of electrical power; and
   c) a read module in functional communication with the non-volatile magnetic bit and configured to observe and communicate each of three magnetic states of the non-volatile magnetic bit, the read module including a read sensor coupled to a read return line;
wherein the non-volatile magnetic bit comprises a pair of substantially co-linear elongated ferromagnetic members and the write module includes a pair of independently operable write coils each associated with a separate ferromagnetic member.

2. The memory device of claim 1, wherein the non-volatile magnetic bit comprises a single elongated ferromagnetic member.

3. The memory device of claim 1, wherein the write module includes a damped oscillator circuit functionally coupled to the write coil, such that an oscillating signal driven through the write coil may be damped.

4. The memory device of claim 1, wherein the write module is configured to write a magnetic state in two clock cycles.

5. The memory device of claim 1, wherein the read sensor includes a Hall effect sensor disposed near the non-volatile magnetic bit.

6. The memory device of claim 1, wherein the read sensor includes a resistive coupled sensor disposed near the non-volatile magnetic bit.

7. The memory device of claim 1, wherein the device includes exactly and only one transistor functionally coupled to the read sensor.

8. A method of making a non-volatile tri-state random access memory device, comprising:
   a) providing a non-volatile magnetic bit;
   b) providing a write module in functional communication with the non-volatile magnetic bit and configured to selectable alter the non-volatile magnetic bit between three magnetic states, the write module including a write coil disposed about the non-volatile magnetic bit and in communication with a source of electrical power; and
   c) providing a read module in functional communication with the non-volatile magnetic bit and configured to observe and communicate each of three magnetic states of the non-volatile magnetic bit, the read module including a read sensor coupled to a read return line;
wherein the non-volatile magnetic bit comprises a pair of substantially co-linear elongated ferromagnetic members and the write module includes a pair of independently operable write coils each associated with a separate ferromagnetic member.

9. The memory device method of claim 8, wherein the non-volatile magnetic bit comprises providing a single elongated ferromagnetic member.

10. The memory device method of claim 8, wherein the write module includes providing a damped oscillator circuit functionally coupled to the write coil, such that an oscillating signal driven through the write coil may be damped.

11. The memory device method of claim 8, wherein the write module is configured to write a magnetic state in two clock cycles.

12. The memory device method of claim 8, wherein the read sensor includes providing a Hall effect sensor disposed near the non-volatile magnetic bit.

13. The memory device method of claim 8, wherein the read sensor includes providing a resistive coupled sensor disposed near the non-volatile magnetic bit.

14. The memory device of claim 8, wherein the device includes a single transistor functionally coupled to the read sensor.

15. A non-volatile random access memory device, comprising:
   a) a non-volatile magnetic bit;
   b) a write module in functional communication with the non-volatile magnetic bit, and configured to selectable alter the non-volatile magnetic bit between magnetic states; and
   c) a read module in functional communication with the non-volatile magnetic bit, and configured to observe and communicate each of magnetic states;
wherein the non-volatile magnetic bit comprises a pair of substantially co-linear elongated ferromagnetic members and the write module includes a pair of independently operable write coils each associated with a separate ferromagnetic member.

16. The non-volatile tri-state random access memory device of claim 15, wherein the read module includes a read sensor coupled to a read return line, and the write module including a write coil disposed about the non-volatile magnetic bit and in communication with a source of electrical power.

17. The non-volatile tri-state random access memory device of claim 16, wherein the write coils wrap around the non-volatile magnetic bit a sufficient amount to cause a writing of readable amount of flux emitting therefrom.

* * * * *